(12) United States Patent
Kawahara et al.

(10) Patent No.: US 8,429,800 B2
(45) Date of Patent: Apr. 30, 2013

(54) METHODS FOR MANUFACTURING PIEZOELECTRIC VIBRATING PIECES

(75) Inventors: Hiroshi Kawahara, Saitama (JP); Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 201 days.

(21) Appl. No.: 12/880,514

(22) Filed: Sep. 13, 2010

(65) Prior Publication Data

US 2011/0062828 A1 Mar. 17, 2011

(30) Foreign Application Priority Data

Sep. 16, 2009 (JP) .................................. 2009-213925
Mar. 25, 2010 (JP) .................................. 2010-069443

(51) Int. Cl.
*H04R 17/10* (2006.01)
*H01L 41/053* (2006.01)

(52) U.S. Cl.
USPC .............. 29/25.35; 29/830; 29/840; 310/340; 310/344; 310/348; 228/120

(58) Field of Classification Search .................. 29/29.35, 29/830, 840, 827; 310/340, 344, 348; 228/120, 228/135
See application file for complete search history.

(56) References Cited

U.S. PATENT DOCUMENTS

| | | | |
|---|---|---|---|
| 7,266,869 B2 * | 9/2007 | Hatanaka et al. | ............. 29/25.35 |
| 2008/0231145 A1 | 9/2008 | Nagano et al. | |
| 2009/0066190 A1 * | 3/2009 | Harima | ......................... 310/348 |
| 2012/0025673 A1 | 2/2012 | Nagano et al. | |

FOREIGN PATENT DOCUMENTS

| | | |
|---|---|---|
| JP | H10-051265 | 2/1998 |
| JP | 2000-077965 | 3/2000 |
| JP | 2005-333658 | 12/2005 |
| JP | 2008-147895 | 6/2008 |

(Continued)

OTHER PUBLICATIONS

Office Action for related Japanese Patent Application No. 2010-069443, 4 pages, dated Oct. 31, 2011.

(Continued)

*Primary Examiner* — A. Dexter Tugbang
(74) *Attorney, Agent, or Firm* — Klarquist Sparkman, LLP

(57) ABSTRACT

In an exemplary method a piezoelectric wafer is prepared on which multiple piezoelectric frames are formed. Each frame has a piezoelectric vibrating piece including excitation electrodes, and a frame portion surrounds the vibrating piece. A lid wafer is prepared on which multiple respective lids are formed, each sized substantially similarly to the respective frames. A base wafer is prepared on which multiple of bases are formed, each sized substantially similarly to the respective frames. Each base has through-holes. Stripes of a first bonding film are formed on both major surfaces of the piezoelectric wafer around the periphery of each frame. Stripes of a second bonding film are formed on the inner major surface of the lid wafer, corresponding to respective stripes of the first bonding film. Stripes of a third bonding film are formed on the inner major surface of the base wafer, corresponding to respective stripes of the first bonding film. A bonding material is placed between the stripes of first bonding film and respective stripes of second bonding film, and between stripes of first bonding film and respective stripes of third bonding film, by which the three wafers are bonded together after being aligned with each other in a sandwich manner.

6 Claims, 12 Drawing Sheets

FOREIGN PATENT DOCUMENTS

| | | |
|---|---|---|
| JP | 2008-182468 | 8/2008 |
| JP | 2008-271491 | 11/2008 |
| JP | 2009152824 A * | 7/2009 |
| JP | 2010-252051 | 11/2010 |

OTHER PUBLICATIONS

Office Action for related Japanese Patent Application No. 2010-069443, 3 pages, dated Jan. 26, 2012.

* cited by examiner

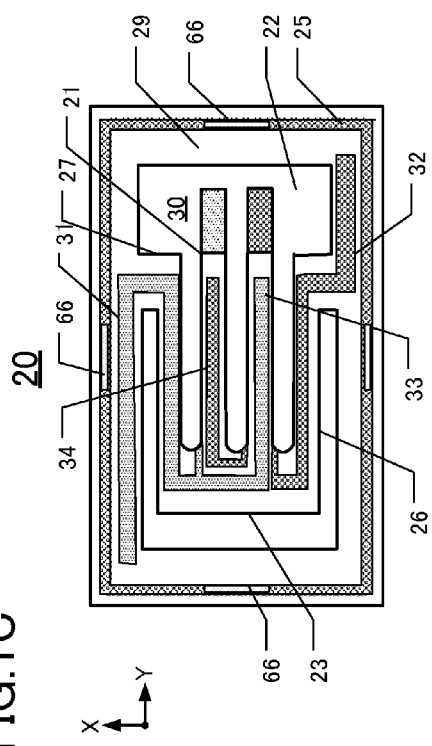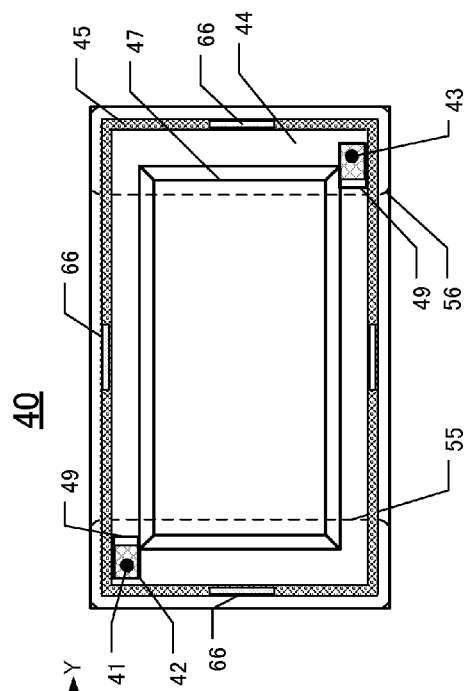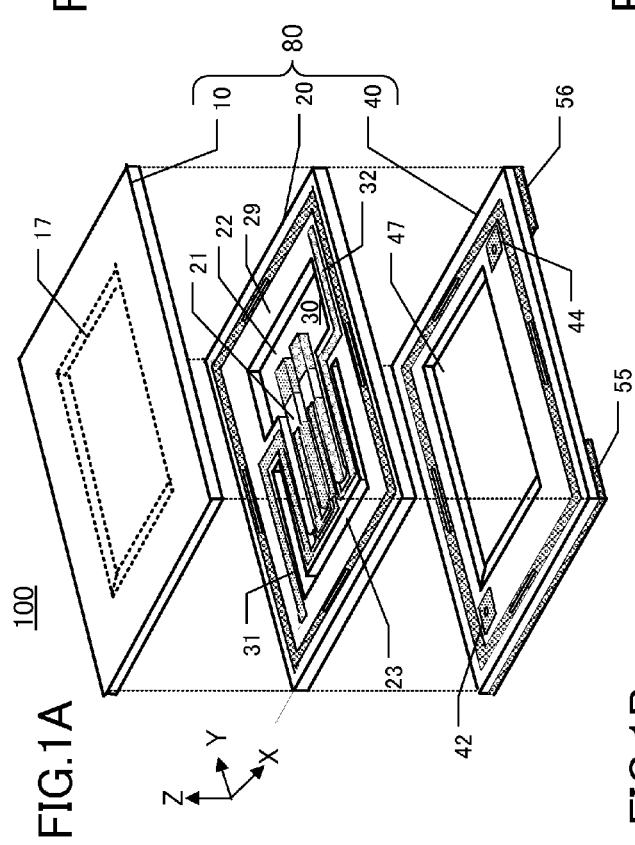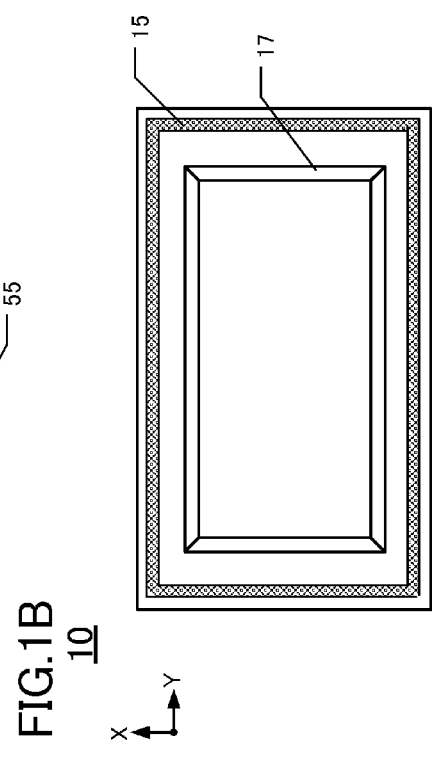

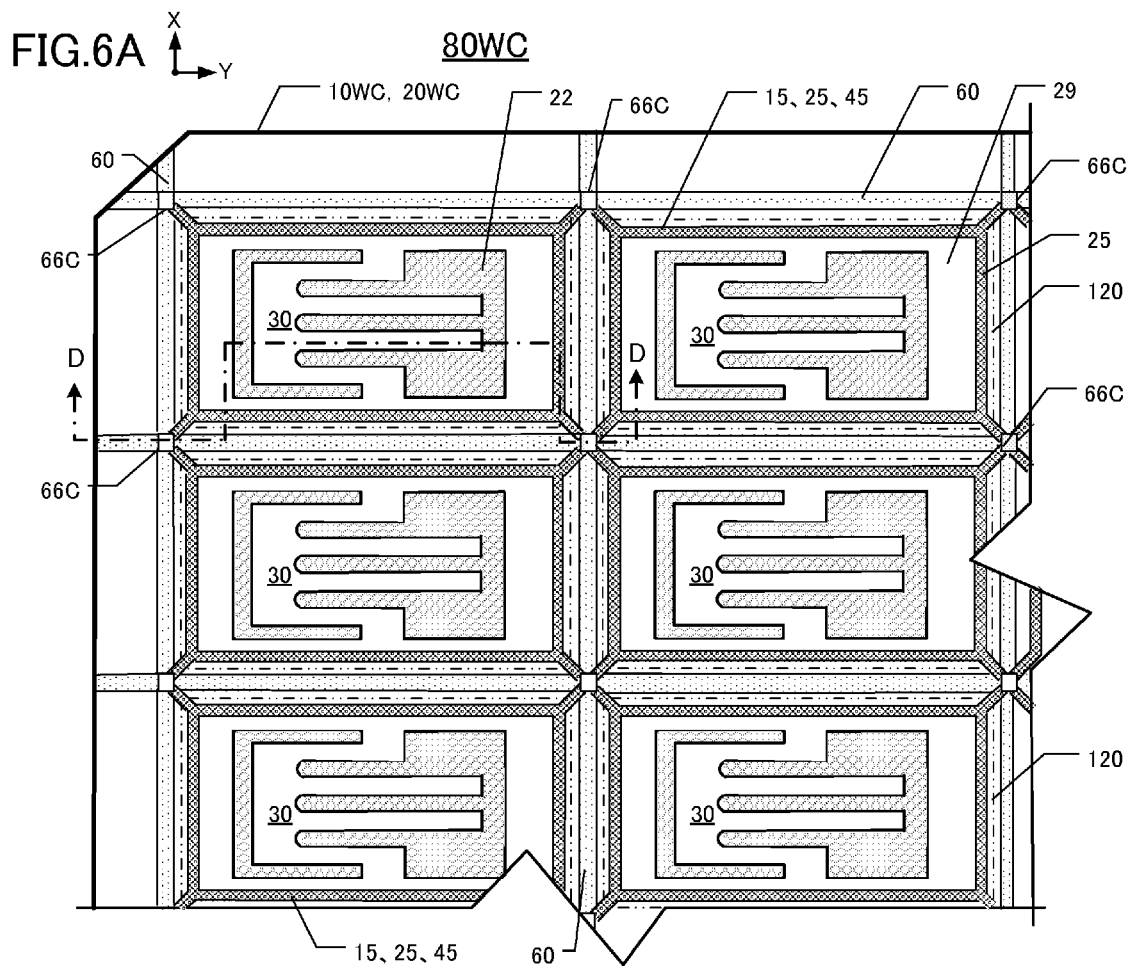
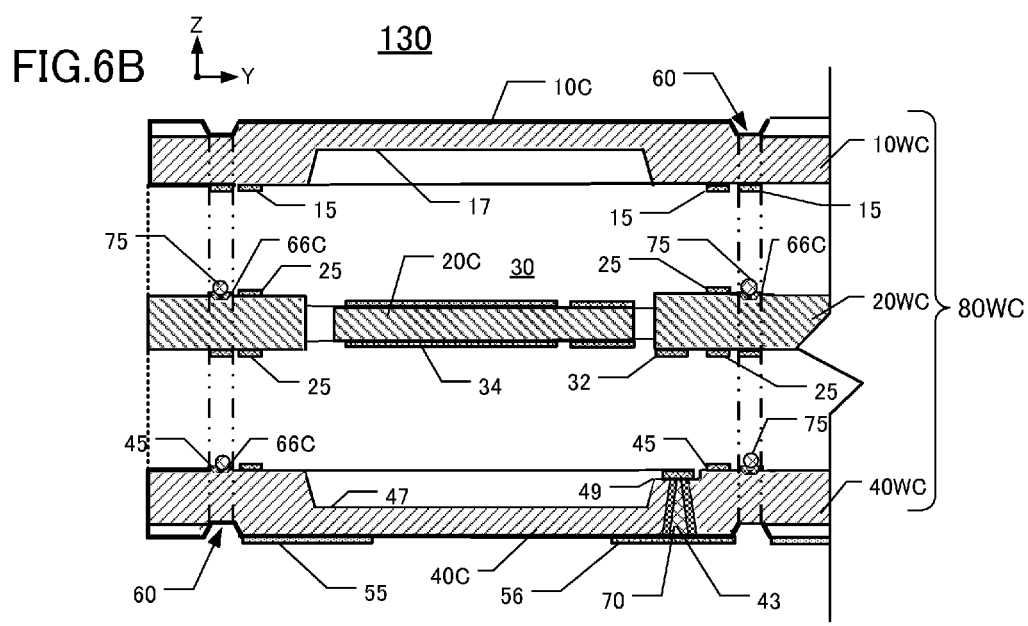

METHODS FOR MANUFACTURING PIEZOELECTRIC VIBRATING PIECES

CROSS-REFERENCE TO RELATED APPLICATION

This application claims priority to and the benefit of Japan Patent Application No. 2009-213925, filed on Sep. 16, 2009, and Japan Patent Application No. 2010-069443, filed on Mar. 25, 2010 in the Japan Patent Office, the disclosures of which are incorporated herein by reference in their respective entireties.

FIELD

This disclosure relates to, inter alia, piezoelectric devices and to methods for manufacturing them on a mass-production basis.

DESCRIPTION OF THE RELATED ART

With the progress of miniaturization and/or increases in the operating frequency of mobile communication apparatus and office automation (OA) equipment, piezoelectric devices used in this equipment must be progressively smaller. For reducing manufacturing costs, good methods are required for mass-production manufacturing of piezoelectric devices.

According to the manufacturing methods disclosed in Japan Unexamined Patent Application No. 2008-182468, individual lids are placed one at a time on respective packages. More specifically, a package wafer is prepared on which are formed multiple packages. Each package contains a respective piezoelectric vibrating piece and includes a positioning guide. After placement, the lids and packages are bonded together at the positioning guides to form air-tight bonds. Then, the package wafer is cut piece-by-piece to separate the multiple piezoelectric devices from one another. This method can prevent misalignment of the lids to their respective packages, and is amenable somewhat to mass-production. However, in the JP '468 method, whereas multiple packages (each accommodating a respective piezoelectric vibrating piece) are formed on a single wafer, the lids are formed individually. Thus, an individual lid must be placed on each package formed on the wafer. This is inefficient for mass-production.

In view of the foregoing, an object of the invention is to provide piezoelectric vibrating devices that can be made with higher productivity and have long-term stability.

SUMMARY

According to a first aspect of the invention, piezoelectric vibrating devices are provided. An embodiment of such a device comprises a piezoelectric frame including a piezoelectric vibrating piece having excitation electrodes. A frame portion surrounds the piezoelectric vibrating piece, which is attached to the frame portion. The frame portion includes stripes of a first bonding film situated inboard of the periphery of the frame portion on both major surfaces of the frame portion. The device includes a lid including stripes of a second bonding film formed on one major surface thereof. The stripes of the second bonding film are aligned with and bonded to corresponding stripes of the first bonding film on the first major surface of the frame portion, thereby bonding the piezoelectric frame and lid together. The device also comprises a base including stripes of a third bonding film situated inboard of the periphery of the base on a first major surface of the base. The stripes of the third bonding film are aligned with and bonded to corresponding stripes of the first bonding film on the second major surface of the frame portion, thereby bonding the base to the piezoelectric frame. At least one through-holed extends through the thickness of the base from one major surface to the other. The material used for bonding together the bonding films has a different melting temperature than the material used for sealing the through-hole(s). These features enable the subject piezoelectric devices to be mass-produced while exhibiting long-term stability of performance and structure.

Some embodiments include at least one concavity at which the bonding material is applied on the stripes of the first bonding film. The stripes of the first bonding film are formed with a designated width on the frame portion. Similarly, the respective stripes of the second and third bonding films are formed on the lid and base, respectively, with designated widths.

A typical frame portion has a rectangular plan profile. Since the stripes of the first bonding film are situated just inboard of the outer peripheral edge of the frame portion, the stripes are arranged as a rectangular pattern having four sides. Similarly, the lid typically has a rectangular plan profile, sized similarly to the piezoelectric frame. Since the stripes of the second bonding film are situated just inboard of the outer peripheral edge of the lid, the stripes are arranged as a rectangular pattern having four sides that are alignable with the stripes of the first bonding film. Similarly, the base typically has a rectangular plan profile, sized similarly to the piezoelectric frame. Since the stripes of the third bonding film are situated just inboard of the outer peripheral edge of the base, the stripes are arranged as a rectangular pattern having four sides that are alignable with the stripes of the first bonding film.

One or both major surfaces of the frame portion on which the first bonding film is formed can be roughened. Similarly, the major surface of the lid on which the second bonding film is formed and the major surface of the base on which the third bonding film is formed can be roughened.

The lid and/or base of the piezoelectric vibrating device can be made of glass, ceramic, or a piezoelectric material.

The piezoelectric vibrating piece can be an AT-cut crystal vibrating piece or a tuning-fork type crystal vibrating piece.

According to another aspect, methods are provided for manufacturing piezoelectric vibrating devices. An embodiment of such a method comprises preparing a piezoelectric wafer including multiple piezoelectric frames. Each piezoelectric frame comprises a piezoelectric vibrating piece including excitation electrodes and a frame portion that surrounds the piezoelectric vibrating piece. A lid wafer is prepared including multiple lids each having substantially similar size and shape as a corresponding frame on the piezoelectric wafer. Also prepared is a base wafer including multiple bases each having substantially similar size and shape as a corresponding frame on the piezoelectric wafer. Each base has at least one through-hole penetrating from one major surface of the base to the opposing major surface. Stripes of a first bonding film are formed on both major surfaces of each frame in the piezoelectric wafer, just inboard of the peripheral edge of the frame, thereby forming a rectangular pattern of stripes. Stripes of a second bonding film are formed on a major surface of the lid wafer in a pattern corresponding to the pattern of stripes of the respective first bonding film. Stripes of a third bonding film are formed on a major surface of the base wafer in a pattern corresponding to the pattern of stripes of the respective first bonding film. The wafers are stacked in registration with each other and bonded together by application of a bonding material between the individual wafers. Specifically, the bonding material is applied between the stripes of the second bonding film and corresponding stripes of the respective first bonding film. Bonding material is also applied between the stripes of the third bonding film and corresponding stripes of the respective first bonding film. The resulting structure is a three-wafer sandwich of the frame wafer situated between the lid wafer and base wafer. This structure is also termed herein a "package wafer." This manufacturing method provides high productivity at reduced manufacturing cost.

The manufacturing method can further comprise sealing the through-hole(s) in each base with a sealing material after bonding the wafers together. The bonding material (for bonding stripes) and the sealing material desirably have different respective melting temperatures. The bonded three-wafer sandwich is cut along the peripheries of the frames to detach individual piezoelectric devices from the wafer sandwich.

The stripes of the first bonding film can be formed on surfaces that define respective concavities. Each concavity is formed inboard of the extreme periphery of the piezoelectric vibrating device. After forming the stripes of the bonding films the bonding material is placed on the concavities. During bonding, the bonding material is melted and migrates along the stripes by capillary action.

As noted, the major surfaces of the frame portion to which the first bonding film is applied, the major surface of the lid to which the second bonding film is applied, and the major surface of the base to which the third bonding film is applied can all be roughened. As applied, the stripes of the first bonding film desirably form, for each piezoelectric vibrating device, a rectangular pattern with four sides, situated inboard of the extreme periphery of the frame portion. Similarly, the stripes of the second bonding film, as applied, form a rectangular pattern with four sides, situated inboard of the extreme periphery of the lid, and the stripes of the third bonding film, as applied, form a rectangular pattern with four sides, situated inboard of the extreme periphery of the base.

According to this invention, multiple piezoelectric devices can be formed rapidly and efficiently on a package wafer, while producing vibrating devices exhibiting enhanced stability and durability.

BRIEF DESCRIPTION OF THE DRAWINGS

FIG. 1A is a perspective exploded view of a first embodiment of a crystal vibrating device, comprising a tuning-fork type crystal vibrating piece.

FIG. 1B is a plan view of the inner major surface of a lid used in the first embodiment.

FIG. 1C is a plan view of the upper major surface of a crystal frame, of the first embodiment, including the tuning-fork type crystal vibrating piece.

FIG. 1D is a plan view of the inner major surface of a base of the first embodiment.

FIG. 6A is a plan view of a fourth embodiment of a package wafer as viewed from above the outer major surface of the lid wafer.

FIG. 6B is an enlarged elevational section along the line D-D of FIG. 6A.

DETAILED DESCRIPTION

Figure 2:
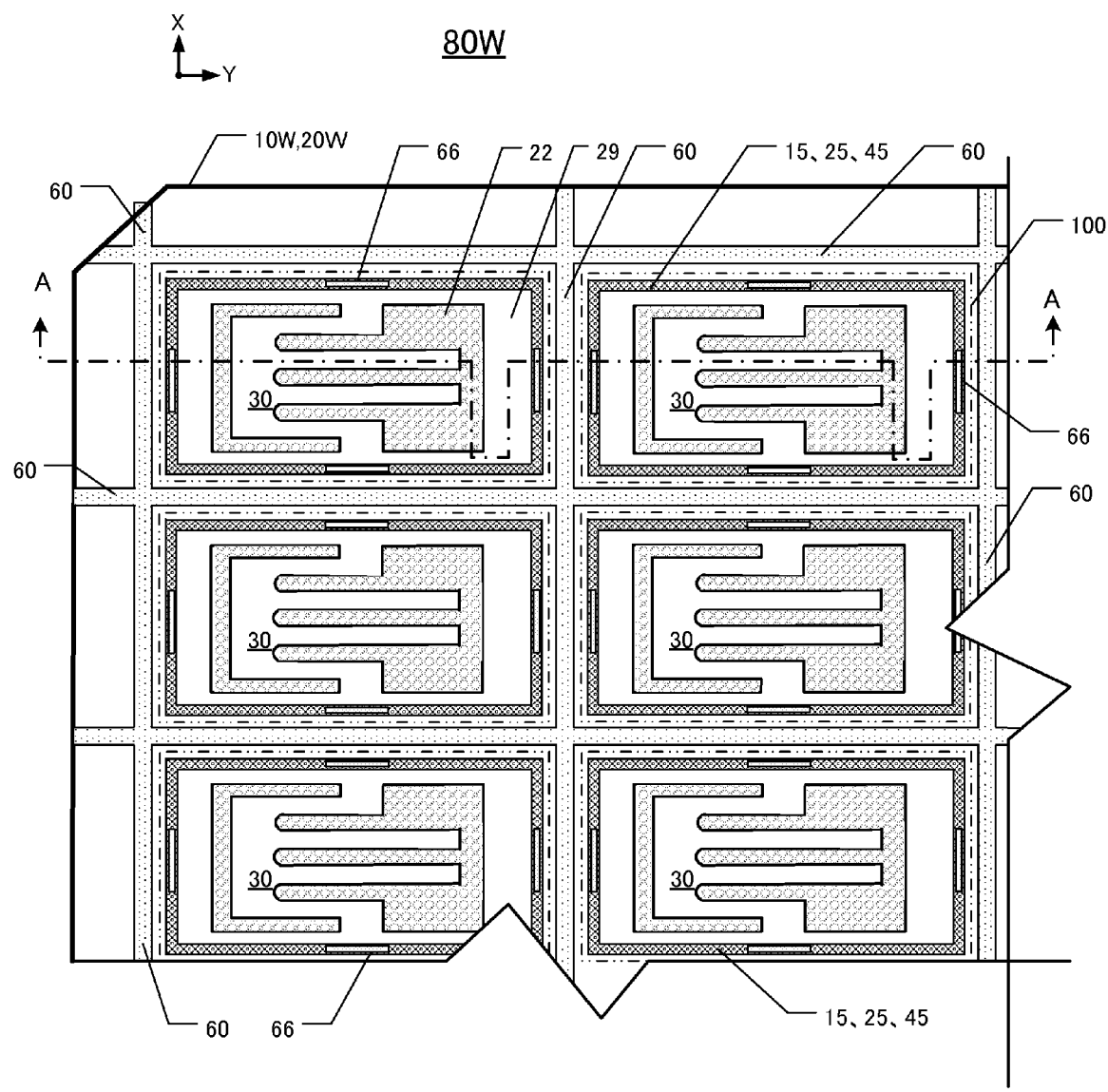
FIG. 2 is a plan view of a package wafer as viewed from above the outer major surface of the lid wafer.

This invention is described below in the context of representative embodiments that are not to be regarded as limiting in any way.

First Embodiment of Crystal Vibrating Device

FIGS. 1A and 1B schematically depict the first embodiment of a crystal vibrating device 100 comprising a tuning-fork type crystal vibrating piece 30. FIG. 1A is a perspective view showing the manner in which a base 40, a crystal frame 20, and a lid 10 are aligned with each other for bonding together. The crystal vibrating device 100 comprises a tuning-fork type crystal vibrating piece 30, which is formed as part of the crystal frame 20. FIG. 1B is a plan view of the inner major surface of the lid 10, FIG. 1C is a plan view of the upper major surface of the crystal frame 20, and FIG. 1D is a plan view of the inner major surface of the base 40.

As shown in FIG. 1A, the crystal vibrating device 100 comprises the lid 10 situated top-most, the crystal frame 20, and the base 40. The tuning-fork type crystal vibrating piece 30 includes a crystal frame 20 formed by etching. The crystal frame 20 includes the tuning-fork type crystal vibrating piece 30, located in the center of the crystal frame and an outer frame portion 29 surrounding the crystal vibrating piece 30. A void 22 is formed between the tuning-fork type crystal vibrating piece 30 and the outer frame portion 29. The void 22 defines the outline profile of the tuning-fork type crystal vibrating piece 30, and is formed by etching. The thickness of the tuning-fork type crystal vibrating piece 30 is equal to the thickness of the outer frame portion 29. The lid 10 and base 40 can be made of glass, ceramic, or crystal (e.g., quartz crystal). For reasons described below, the lid 10 desirably is made of a piezoelectric crystal material (e.g., quartz crystal).

One of the indicators of hardness of various industrial materials is expressed as a "Knoop hardness number." Higher Knoop hardness numbers indicate greater hardness, while lower Knoop hardness numbers indicate greater softness. The Knoop hardness number of the borosilicate glass commonly used for lids and bases is 590 kg/mm$^2$, while the Knoop hardness number of quartz crystal is 710 to 790 kg/mm$^2$. Thus, using crystal instead of glass for the lid 10 and base 40 of the crystal vibrating device 100 provides the device with a greater hardness. When fabricating this device to a designated hardness, if glass is used it usually must be thicker than a corresponding thickness of crystal having the same hardness. Hence, if crystal is used, the respective part usually can have a thinner profile. As a result, whenever crystal is used for the lid and the base of a piezoelectric device having the same hardness as glass, the piezoelectric device can be more miniaturized and/or have a thinner profile.

Whenever a piezoelectric vibrating device 100 is being manufactured or being mounted to a printed circuit board, heat is normally applied to the device. If a material other than crystal is used for making the lid 10 and base 40, the interior of the vibrating device 100 may become stressed due to differences in the respective thermal expansion coefficients of the crystal frame 20 versus of the lid 10 and base 40. The greater the difference in thermal expansion coefficient, the greater the stress in certain regions (particularly in the interior of the device). Greater stress can cause fracture of the corners of the outer frame portion 29 of the crystal frame 20, which tend to have lower stress intensity than other regions. Thus, it is desirable to narrow the differences in respective thermal expansion coefficients of the lid 10 and base 40 versus the crystal frame 20. If the frame 20 is made of crystal, crystal (rather than glass) is the desired material for making the lid 10 and base 40 because the thermal expansion coefficients are more nearly equal. The resulting narrowing of the differences in thermal expansion coefficient substantially reduces stresses in the interior of the device. Moreover, using crystal facilitates miniaturization or provision of a thinner profile of the crystal vibrating device 100.

The crystal vibrating device 100 comprises a package 80 collectively formed by the lid 10 and the base 40 sandwiching the crystal frame 20. As shown in FIG. 1B, the inner major surface of the lid 10 includes has a lid concavity 17 that faces the crystal frame 20 in the package 80. A second bonding film 15 is applied to the inner major surface of the lid 10 as "stripes" located inboard of the extreme periphery of the lid 10 and facing the crystal frame 20. The stripes of the second bonding film 15 as applied form a rectangular pattern with four sides.

As shown in FIG. 1C, the crystal frame 20 comprises the tuning-fork type crystal vibrating piece 30, an outer frame portion 29, supporting arms 26, and connecting portions 27, all formed integrally in a crystal wafer having the same thickness as the crystal frame. The tuning-fork type crystal vibrating piece 30 comprises a pair of vibrating arms 21 and a base portion 23. A first bonding film 25 is applied to the depicted major surface of the outer frame portion 29, inboard of the extreme periphery of the outer frame portion 29 and facing the lid 10. The first bonding film 25 is applied as stripes that form a rectangular pattern with four sides. Note that stripes of the first bonding film 25 are also applied on the opposite (lower) major surface of the crystal frame (facing the base 40) in the same manner as shown in FIG. 1C. Thus, stripes of the first bonding film 25 are applied to both major surfaces of the outer frame portion 29.

The crystal frame 20 comprises a first base electrode 31 and a second base electrode 32 extending on the outer frame portion 29, the base portion 23, the supporting arms 26, and the connecting portions 27. A first excitation electrode 33 and a second excitation electrode 34 are formed on upper, lower, and side surfaces of the vibrating arms 21. The first excitation electrode 33 is connected to a first base electrode 31, and the second excitation electrode 34 is connected to the second base electrode 32.

The tuning-fork type crystal vibrating piece 31 is very small, and oscillates at a frequency of 32.768 kHz, for example.

The first and second base electrodes 31, 32, and the first and second excitation electrodes 33, 34 comprise respective metal layers. Example metal layers are 400-2000 Ångstroms of gold (Au) layered on 150-700 Ångstroms of chromium (Cr). Titanium (Ti) can be used instead of chromium, and silver (Ag) can be used instead of gold. A pair of supporting arms 26 extend parallel to the vibrating arms 21 (Y-direction) from one end of the base portion 23. The supporting arms 26 connect the respective vibrating arms to respective connecting portions 27, and thus to the outer frame portion 29. The supporting arms 26 reduce oscillation leakage from the vibrating arms 21 to outside the crystal vibrating device 100. The supporting arms also lessen the vulnerability of the device to external temperature changes and physical impacts.

As shown in FIG. 1D, the inner major surface of the base 40 includes a base concavity 47 facing the crystal frame 20. The base concavity 47 can be formed by etching, thereby concurrently forming first and second through-holes 41, 43. Steps 49 for connecting electrodes are formed on the inner major surface of the base 40. First and second connecting electrodes 42, 44 are formed on respective steps 49. Metallized first and second external electrodes 55, 56 are formed on the outer (lower) major surface of the base 40. Stripes of a third bonding film 45 are applied on the inner major surface of the base 40, inboard of the extreme periphery of the base 40 and facing corresponding stripes on the lower major surface of the crystal frame 20. As applied, the stripes of the third bonding film 45 have a rectangular shape with four sides.

A metal film (see FIG. 3A) is formed on interior surfaces of the first and second through-holes 41, 43. The metal film is formed, by photolithography, as the first and second connecting electrodes 42, 44 are formed. The first connecting electrode 42 is connected to the first external electrode 55 on the outer major surface of the base 40 via the metal film of the first through-hole 41. Similarly, the second connecting electrode 44 is connected to the second external electrode 56 on the outer major surface of the base 40 via the metal film of the second through-hole 43.

The first and second base electrodes 31, 32, formed on the second (lower) major surface of the outer frame portion 29, are connected to the first and second connecting electrodes 42, 44, respectively, formed on the inner major surface of the base 40. Thus, the first base electrode 31 is electrically connected to the first external electrode 55, and the second base electrode 32 is electrically connected to the second external electrode 56.

Each stripe of the first bonding film 25 applied to the surfaces of the crystal frame 20 comprises metal layers, for example 400-1500 Ångstroms of gold (Au) layered on 150-700 Ångstroms of chromium (Cr). If the crystal frame 20 and base 40 are made of crystal, the stripe patterns of the second and third bonding films 15, 45 as applied desirably are sized and configured similarly to the stripe pattern of the first bonding film 25. If the lid 10 and base 40 are made of glass or ceramic, the second and third bonding films 15, 45 each comprise a single layer of gold (Ag).

As shown in FIGS. 1C and 1D, corresponding stripes of the first and third bonding films 25, 45 on the crystal frame 20 and base 40, respectively, face each other. Each of the bonding-film stripes includes a concavity 66 formed near the center of each stripe, on each side of the rectangular stripe pattern. To distinguish the concavity 66 from the bonding film 25 in the drawing, the concavities 66 are shown as non-hatched (white) regions, but it will be understood that bonding-film material also extends into the respective concavities 66 (see FIG. 3B). Respective bonding balls 75, used for bonding the wafers together to form the package wafer, are placed on the concavities 66, as described further below.

FIG. 2 is a plan view of the upper (outer) major surface of a package wafer 80W, as viewed from above the lid wafer 10W. In this figure, the lid wafer 10W is illustrated as if it were transparent. Thus, FIG. 2 mainly shows the tuning-fork type crystal vibrating pieces 30 of the crystal wafer 20W. For the following description, regions each corresponding to a profile of a respective one crystal vibrating device 100 (on the X-Y plane) is illustrated using a virtual line (two-dotted chain line). To distinguish the tuning-fork type crystal vibrating piece 30 from the outer frame portion 29, the void 22 is illustrated with a mesh.

As shown in FIG. 2, cutting grooves 60 are formed on the outer major surface of the lid wafer 10W. Respective cutting grooves 60 are formed on the outer major surface of the base wafer 40W (see FIG. 3) at the same positions (X-plane) as respective cutting grooves 60 formed on the lid wafer 10W. For cutting into respective devices, the package wafer 80W is mounted to a dicing film (not shown) and cut using a dicing saw. The cutting grooves 60 effectively prevent cracking the devices 100 as the devices are being cut from the package wafer. The dicing saw moves linearly so that the cuts define the extreme peripheries of the lid wafer 10W and base wafer 40W, respectively. The depth of each cutting groove 60 is in the range of 20 to 40 μm. By forming the cutting grooves 60 on the lid wafer 10W and the base wafer 40W, cutting loads are reduced, and work efficiency is enhanced. The cutting grooves 60 can also alleviate chipping or cracking of the package wafer 80W during dicing.

In FIG. 2, the stripes of the second bonding film 15 formed on the inner major surface of the lid wafer 10W, the stripes of the first bonding film 25 formed on both major surfaces of the crystal wafer 20W, and the stripes of the third bonding film 45 formed on the inner major surface of the base wafer 40W are in registration with each other in their respective X-Y planes. The stripes of the second, first, and third bonding films 15, 25, 45 are located on respective inner major surfaces so that no stripe is adjacent to or removed by a respective cutting groove 60. This prevents the metal of the bonding films from attaching to the blade of the dicing saw.

The concavities 66 are formed on the stripes of the first bonding film 25 near mid-length of each respective stripe. As noted above, a bonding ball 75 is placed in each concavity 66 for bonding purposes. As the bonding ball 75 melts, the melt spreads along the stripes of the first bonding film 25 by capillary action to "wet" the surface of the first bonding film. Since the distances between adjacent concavities 66 are substantially equal, the surface of the first bonding film 25 can be fully wetted in minimal time. Although not illustrated, the melt also spreads on the stripes of the third bonding film 45 in the same manner.

Figure 3A:
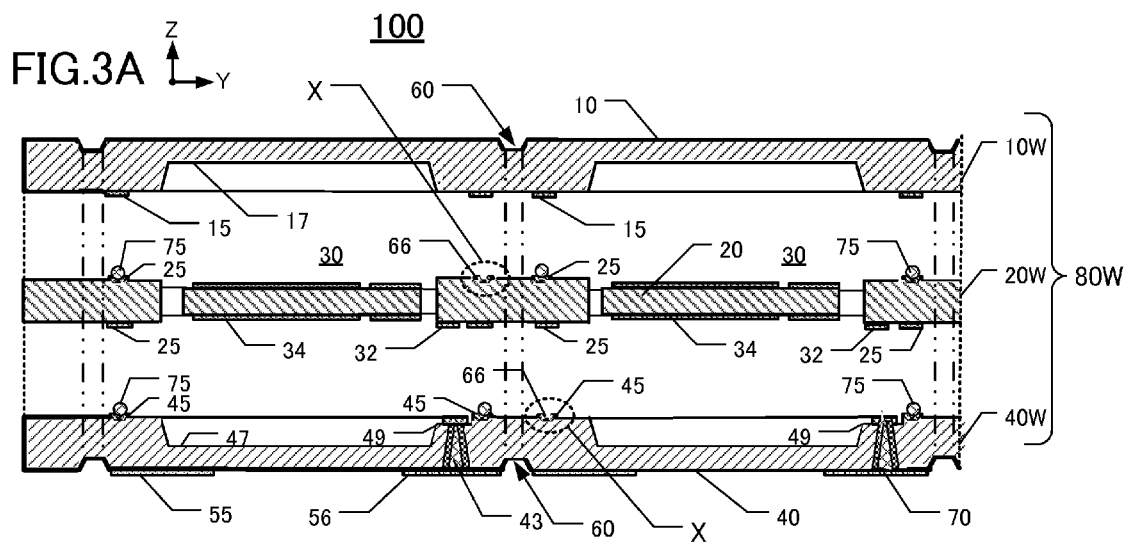
FIG. 3A is an elevational section, along the line A-A of FIG. 2, of the package wafer of the first embodiment, depicting respective major surfaces that are bonded and lines along which the package wafer is cut to separate individual piezoelectric devices from the package wafer.
Figure 3B:
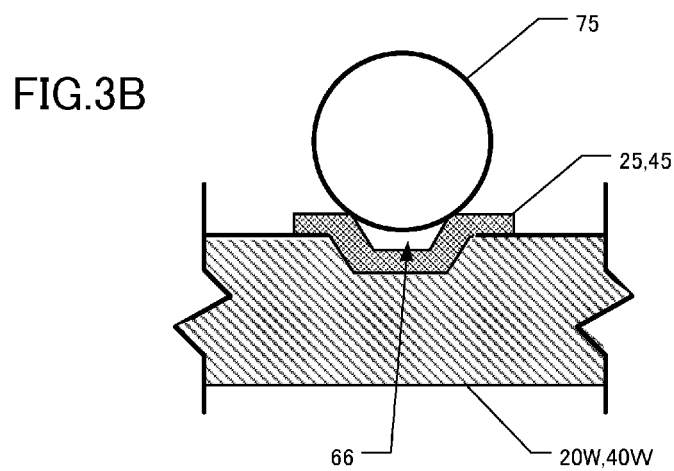
FIG. 3B is an enlargement of the region denoted "X" in FIG. 3A.

FIG. 3A is an elevational section along the line A-A of the package wafer 80W containing multiple crystal vibrating devices 100. The wafers are shown separated from each other for clarity; in an actual package wafer the wafers are bonded together. FIG. 3B is an enlarged sectional view of the region denoted "X" in the crystal wafer 20W and in the base wafer 40W of FIG. 3A. The area shown in FIG. 3A corresponds to two crystal vibrating devices 100. A virtual line (two-dotted chain line) denotes regions in which the package wafer 80W is cut to separate discrete vibrating devices from one another.

As shown in FIG. 3A, the package wafer 80W comprises the lid wafer 10W on which multiple lids 10 are formed, the crystal wafer 20W on which multiple crystal frames 20 are formed, and the base wafer 40W on which multiple bases 40 are formed. Cutting grooves 60 are formed on the lid wafer 10W and base wafer 40W in respective regions of their outer major surfaces that delineate individual crystal vibrating devices 100 in the package wafer 80W. The bonding balls 75 (FIG. 3B), made of eutectic metal, supply material for bonding together the wafers of the package wafer 80W to form multiple crystal vibrating devices 100.

The lid concavity 17 is formed on the inner major surface of the lid wafer 10W, while the cutting grooves 60 are formed on the outer major surface of the lid wafer. Both are formed by wet etching. Similarly, the base concavity 47 and the concavities 66 are formed on the inner major surface of the base wafer 40W, while the cutting grooves 60 are formed on the outer major surface by wet-etching. The concavities 66 are also formed on the crystal wafer 20W facing the lid wafer 10W.

The first bonding film 15 is formed as a pattern of stripes on the major surface of the lid wafer 10W facing the crystal wafer 20W. Each pattern is located inboard of the extreme periphery of a region corresponding to the size of the crystal vibrating device 100. The stripes of the first bonding film 25 are formed on both major surfaces of the crystal wafer 20 in patterns that are located inboard of the extreme periphery of a region corresponding to the size of the crystal vibrating device 100. Stripes of the third bonding film 45 are formed on the inner major surface of the base wafer 40W, facing the crystal wafer 20W. The stripes are in patterns that are located inboard of the extreme periphery of a region corresponding to the size of the crystal vibrating device 100. The first bonding film 25 and third bonding film 45 also extend into respective concavities 66 formed on the crystal wafer 20W and the base wafer 40W.

FIG. 3B is an enlarged sectional view of the region denoted "X" on the crystal wafer 20W and the base wafer 40W in FIG. 3A. As shown in FIG. 3B, respective concavities 66 are formed on the crystal wafer 20W and base wafer 40W, and material of the first and third bonding films 25, 45, respectively, extend into the respective concavities. The bonding balls 75 are readily placed on the concavities 66 in preparation for bonding the package together. The width of each concavity 66 is in the range of 50 to 200 μm, and the diameter of the bonding ball 75 is in the range of 80 to 300 μm.

Second Embodiment of Crystal Vibrating Device

Figure 4A:
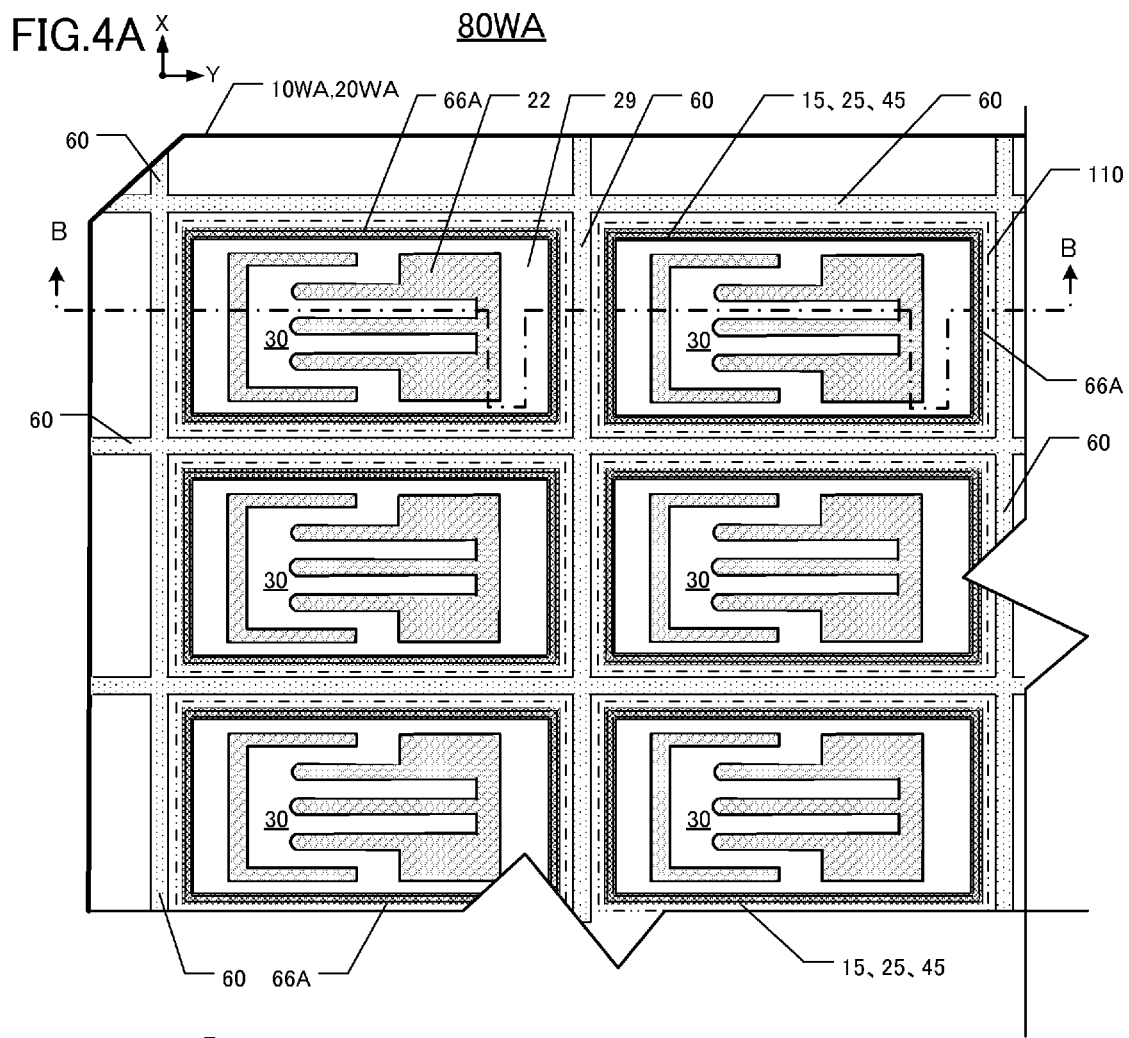
FIG. 4A is a plan view of a second embodiment of a package wafer, as viewed from above the outer major surface of the lid wafer.
Figure 4B:
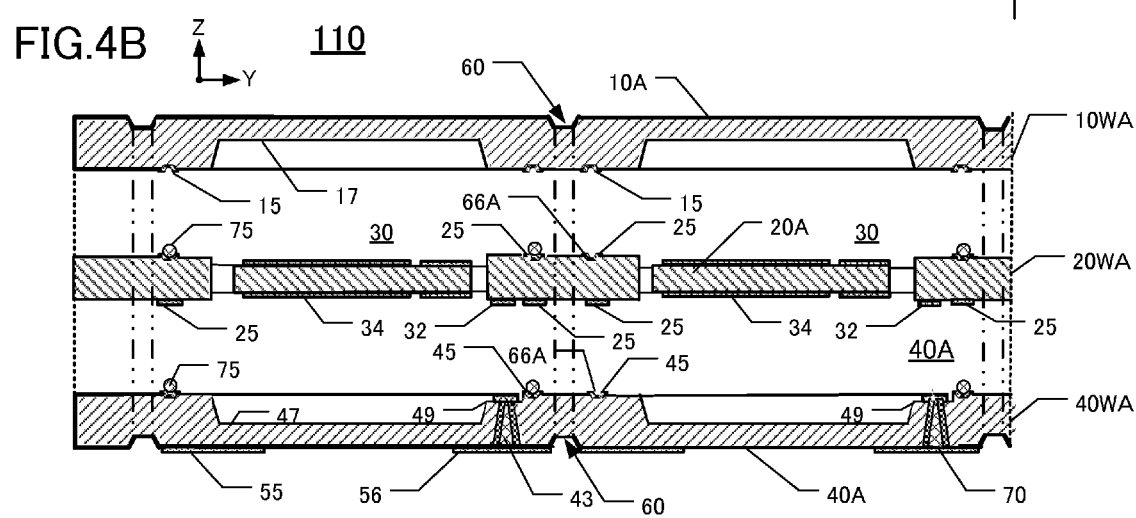
FIG. 4B is an enlarged elevational section along the line B-B of FIG. 4A.

FIG. 4A is a plan view of a package wafer 80WA as viewed from the lid wafer 10WA. Mostly illustrated are the tuning-fork type crystal vibrating pieces 30 formed on the crystal wafer 20WA. FIG. 4B is an enlarged elevational section along the line B-B in FIG. 4A. For better understanding, the wafers are vertically separated from each other in the figure.

The difference between the second embodiment 110 and the first embodiment 100 of a crystal vibrating device 110 is that the respective concavities 66A in the second embodiment are fully coextensive with respective stripes of each of the second, first, and third bonding films 15, 25, 45 formed on major surfaces of the lid wafer 10WA, crystal wafer 20WA, and base wafer 40WA, respectively. This difference from the first embodiment 100 is described below. Further description of features having the same respective reference numerals as used in the first embodiment is omitted.

As shown in FIGS. 4A and 4B, the package wafer 80WA comprises the lid wafer 10WA including the lids 10A, the crystal wafer 20WA including the crystal frames 20A, and the base wafer 40WA including the bases 40A. Cutting grooves 60 extend on the respective outer major surfaces of the lid wafer 10WA and base wafer 40WA so as to delineate the crystal vibrating devices 110 from one another.

The lid wafer 10WA, crystal wafer 20WA, and base wafer 40WA include stripes of the second bonding film 15, stripes of the first bonding film 25, and stripes of the third bonding film 45, respectively. As noted above, respective concavities 66A are coextensive with the respective bonding-film stripes. Concavities 66A need not be formed on the major surface of the lid wafer 10WA, and need not be formed on the major surface of the crystal wafer 20WA facing the base wafer 40WA. As a result, stripes of one of the first bonding films 25 may have no concavity. Since the concavity 66A extends length-wise on all four stripes of the rectangle-shaped pattern of the respective bonding film, bonding balls 75 can be placed easily on the concavities for package bonding. The number of bonding balls 75 actually needed for bonding is arbitrary, basically as many as required.

Third Embodiment of Crystal Vibrating Device

Figure 5A:
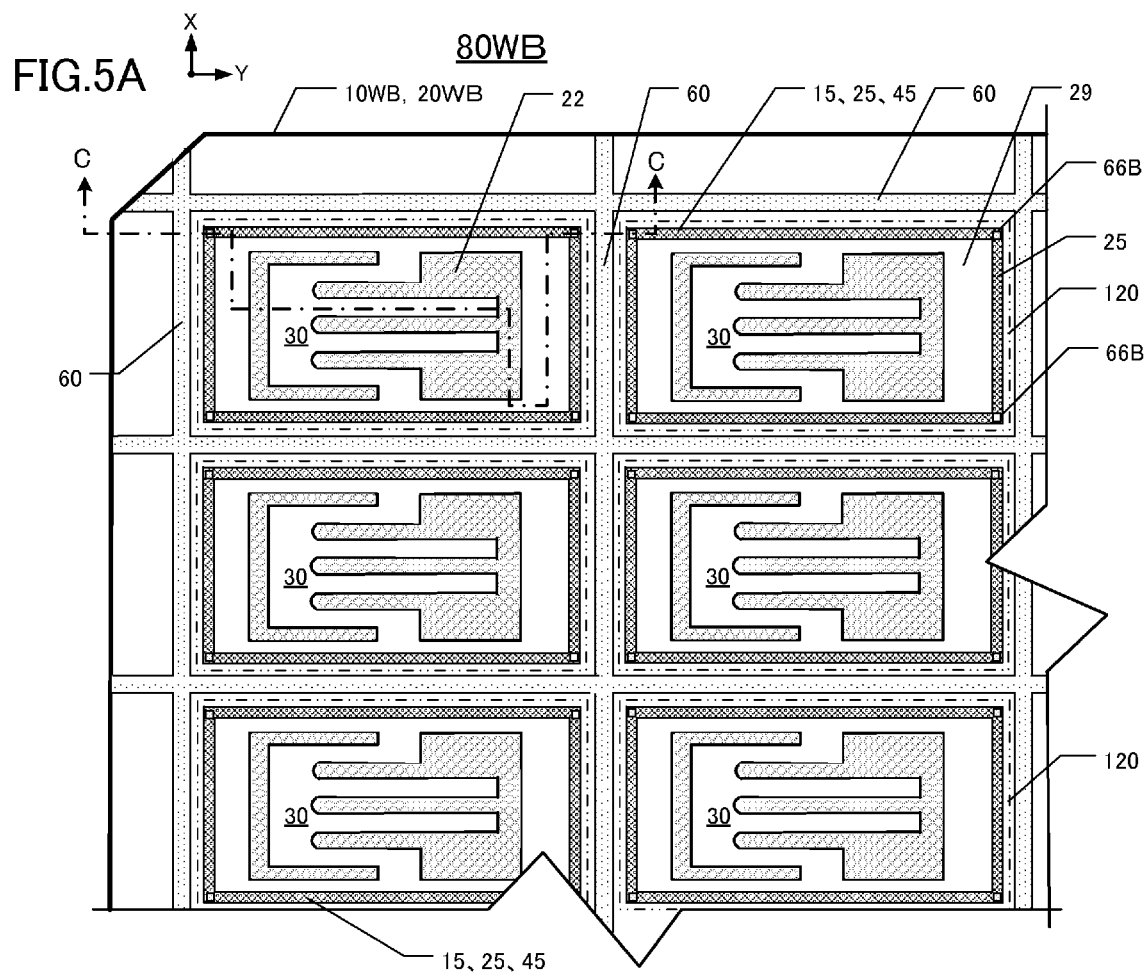
FIG. 5A is a plan view of a third embodiment of a package wafer as viewed from above the outer major surface of the lid wafer.
Figure 5B:
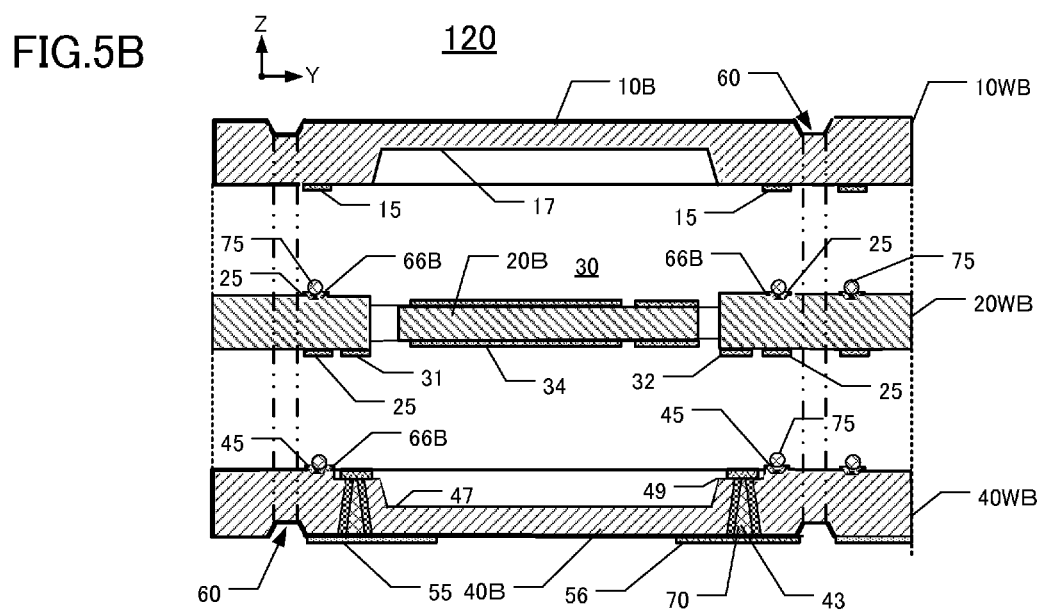
FIG. 5B is an enlarged elevational section along the line C-C of FIG. 5A.

FIG. 5A is a plan view of a package wafer 80WB as viewed from the lid wafer 10WB. Shown mainly are the tuning-fork type crystal vibrating pieces 30 formed on the crystal wafer 20WB. FIG. 5B is an enlarged elevational section along the line C-C in FIG. 5A. For better understanding, the three wafers are shown vertically separated from each other in FIG. 5B.

The main difference between this third embodiment 120 and the first embodiment 100 is that concavities 66B are formed on each of the four corners of the first and third bonding films 25, 45 provided on the crystal wafer 20WB and the base wafer 40WB, respectively. Each concavity 66B is has a square or round profile as viewed from above in the Z-axis direction. These concavities and other differences from the first embodiment of a crystal vibrating device 100 are explained below; descriptions of features having the same respective reference numerals as corresponding features in the first embodiment are not described further.

The package wafer 80WB comprises the lid wafer 10WB defining multiple lids 10B, the crystal wafer 20WB defining multiple crystal frames 20B, and the base wafer 40WB defining multiple bases 40B. Cutting grooves 60 extend linearly on respective outer major surfaces of the lid wafer 10WB and base wafer 40WB, thereby defining the as-cut sizes of the piezoelectric devices in the package wafer 80WB.

As shown in FIGS. 5A and 5B, the lid wafer 10WB comprises stripes of a second bonding film 15 on the major surface of the lid facing the crystal wafer 20WB. The crystal wafer 20WB and the base wafer 40WB comprise stripes of the first and third bonding films 25, 45, respectively, and each respective bonding-film stripe has a concavity 66B at each corner. For example, concavities 66B are defined on the major surface of the crystal wafer 20B facing the lid wafer 10WB, and concavities 66B are defined on the major surface of the base wafer 40WB facing the crystal wafer 20WB. Concavities 66B also can be defined on stripes of the second bonding film 15 on the lid wafer 10WB and on stripes of the first bonding film 25 on the crystal wafer 20WB facing the base wafer 40WB. Each concavity 66B in this embodiment has a substantially square or round profile. A single bonding ball 75 is placed on each concavity 66B, which avoids using an excessive number of bonding balls 75.

Fourth Embodiment of Crystal Vibrating Device

FIG. 6A is a plan view of a package wafer 80WC, according to this embodiment, as seen from the lid wafer 10WC. Shown mainly are the tuning-fork type crystal vibrating pieces 30 formed on the crystal wafer 20WC. Regions corresponding to outline profiles (in the X-Y plane) of crystal vibrating devices 130 of this embodiment are delineated by a virtual line (two-dotted chain line) on the package wafer 80WC. FIG. 6B is an enlarged elevational section along the line D-D of FIG. 6A. For a better understanding, the wafers are shown vertically separated from each other in FIG. 6B.

Stripes of the first bonding film 25 and third bonding film 45 applied to the crystal wafer 20WC and to the base wafer 40WC, respectively, of each crystal vibrating device 130 extend radially from each of the four corners of the rectangular-shaped stripe pattern and intersect one another. Also, a concavity 66C is formed at each respective intersection of the bonding films. The differences in this embodiment from the first embodiment of a crystal vibrating device 100 are explained below, with omission of any further description of features having the same respective reference numerals as corresponding features in the first embodiment.

As shown in FIGS. 6A and 6B, the package wafer 80WC comprises a lid wafer 10WC defining multiple lids 10C, a crystal wafer 20WC defining multiple crystal frames 20C, and a base wafer 40WC defining multiple bases 40C. The crystal wafer 20WC and the base wafer 40WC include stripes of a first bonding film 25 and of a third bonding film 45, respectively. The respective stripes are arranged in a rectangular pattern with four sides.

At each of the intersections of the cutting grooves 60, a stripe of the first bonding film 25 and a stripe of the third bonding film 45 extend radially toward the cutting-groove intersection from each of the nearby four corners of the rectangular stripe patterns. I.e., from each corner of bonding-film stripes, a respective stripe of bonding film extends 45° (relative to the X-axis) to the nearby intersection of cutting grooves 60. The stripes of first bonding film 25 extending from the corners of the respective adjacent rectangular bonding-film patterns intersect one another; similarly, the stripes of third bonding film 45 extending from the corners of the respective adjacent rectangular bonding-film patterns intersect one another.

A respective concavity 66C is situated at each intersection of bonding-film stripes. As shown in FIG. 6B, the intersections of bonding-film stripes are (on the lid wafer 10WC and base wafer 40WC) on respective major surfaces that are opposite the major surface on which the respective cutting grooves 60 are present. Consequently, the concavities 66C are situated on major surfaces that are opposite the major surfaces that include respective cutting grooves 60. As the package wafer 80WC is being diced by sawing in the cutting grooves 60, the concavities 66C are also sawn. Each concavity 66C has a square profile that can support a round object such as a bonding ball 75. One bonding ball 75 is placed on each concavity 66C. Each concavity 66C is situated outside respective outline profiles of adjacent crystal vibrating devices 130. Thus, no concavity 66C exists on any stripe of the first bonding film 25. The stripes of the third bonding film 45 are situated inside regions bounded by respective outline profiles of adjacent crystal vibrating devices 130. As the bonding balls 75 melt, the resulting molten material migrates along the stripes of the first bonding film 25 and third bonding film 45 by capillary action, thereby "wetting" the surfaces of the respective stripes with molten bonding material. Thus, the lid wafer 10WC, the crystal wafer 20WC, and the base wafer 40WC are bonded together firmly.

Since the concavities 66C and cutting grooves 60 are layered relative to each other, when they are being cut by a dicing blade, metal chips may clog the blade. Hence, the stripes of the first bonding film 25 or third bonding film 45 near each concavity 66C desirably are as narrow as possible.

Fifth Embodiment of Crystal Vibrating Device

Figure 7A:
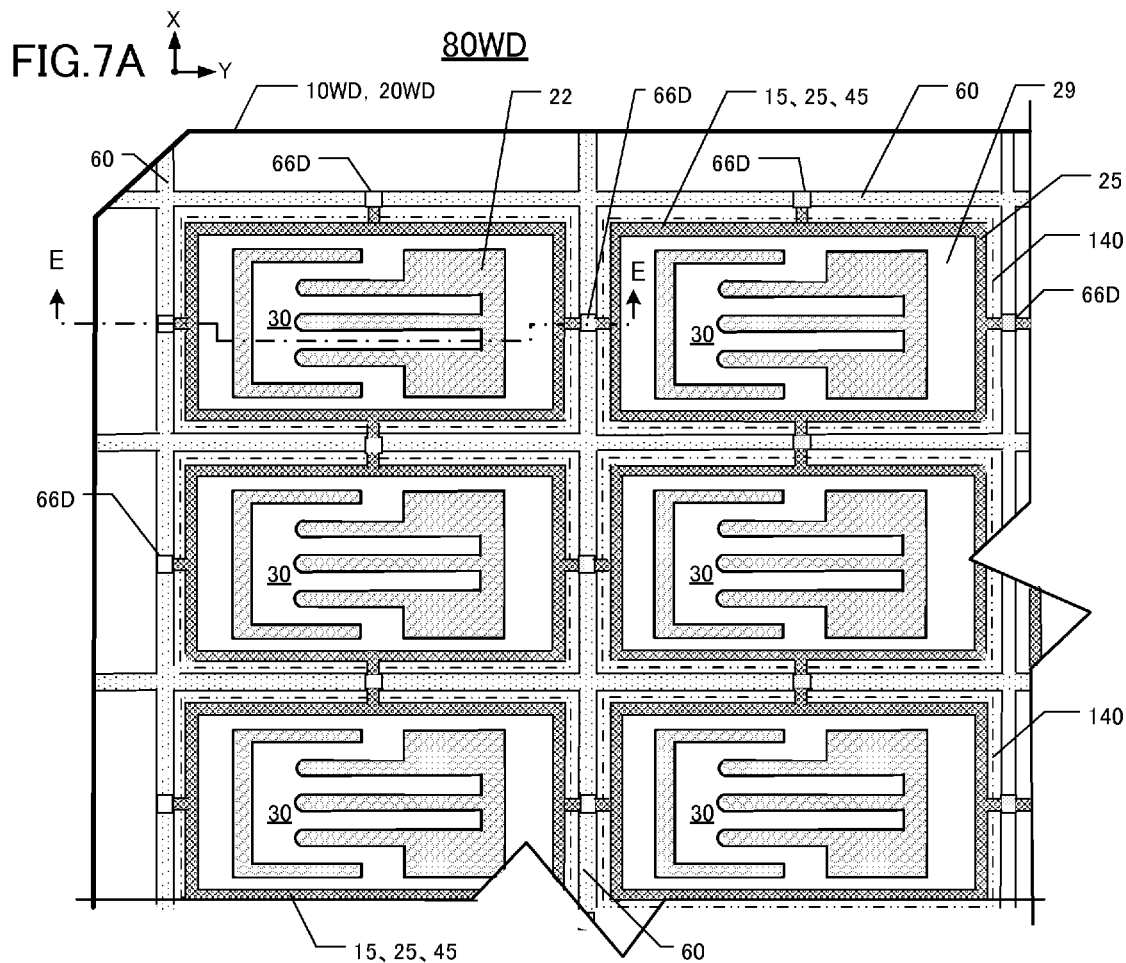
FIG. 7A is a plan view of a fifth embodiment of a package wafer as viewed from above the outer major surface of the lid wafer.
Figure 7B:
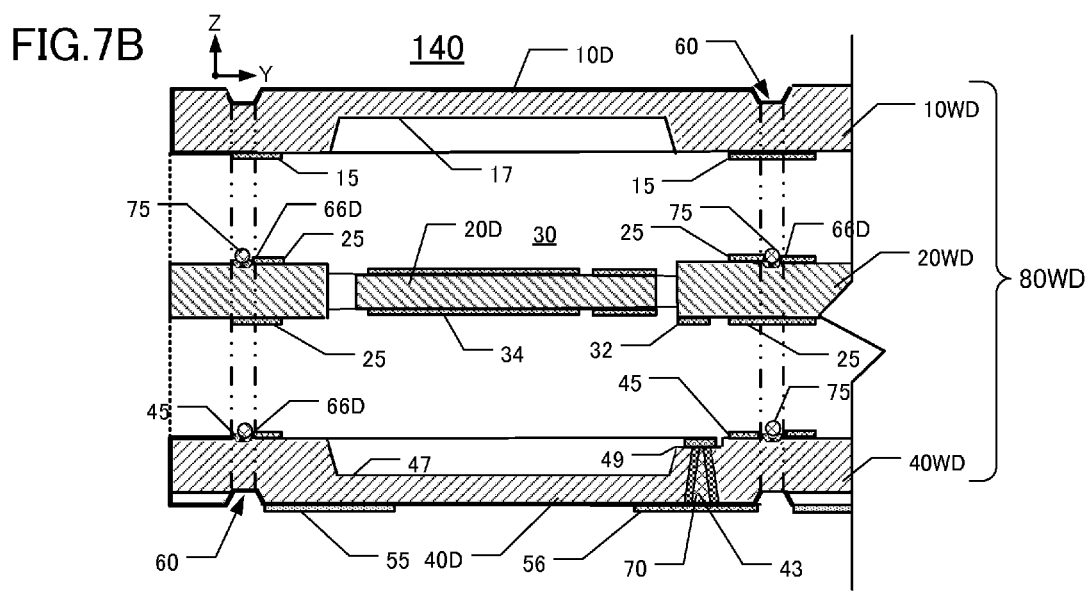
FIG. 7B is an enlarged cross-sectional view along the E-E line of FIG. 7A.

FIG. 7A is a plan view of a package wafer 80WD as viewed from above the lid wafer 10WD. The tuning-fork type crystal vibrating pieces 30 formed on the crystal wafer 20WD are illustrated mainly. The regions on the package wafer 80WD corresponding to respective profiles of crystal vibrating devices 140 (on the XY-plane) are delineated with a virtual line (two-dotted chain line). FIG. 7B is an enlarged elevational section along the line E-E line in FIG. 7A. For better understanding, the wafers are shown vertically separated from each other in FIG. 7B.

The package wafer 80WD comprises a lid wafer 10WD including multiple lids 10E, a crystal wafer 20WD including multiple frames 20WD, and a base wafer 40WD including multiple bases 40D. Turning to FIGS. 7A and 7B, the lid wafer 10WD comprises stripes of the second bonding film 15 on the major surface facing the crystal wafer 20WD. Respective major surface(s) of the crystal wafer 20WD and the base wafer 20WD include stripes of the first bonding film 25 and third bonding film 45, respectively. The stripes on the crystal wafer 20WD and the base wafer 40WD are arranged into rectangular patterns each having four sides.

In addition to the rectangular patterns, a respective stripe of each of the first bonding film 25 and third bonding film 45 extends from the center of each stripe of the rectangle toward the adjacent respective cutting groove 60. Thus, stripes of the first bonding film 25 extend from adjacent crystal frames 20D toward each other and intersect with each other. Similarly, stripes of the third bonding film 45 extend from adjacent bases 40D toward each other and intersect each other. Respective concavities 66D are situated on each intersection. As shown in FIG. 7B, the intersections are situated on major surfaces that are opposite to major surfaces on which the cutting grooves 60 are situated. Hence, the concavities 66D are situated on major surfaces that are opposite to major surfaces that include the cutting grooves 60. Each concavity 66D has a square or round shape capable of supporting one bonding ball 75.

The concavities 66D in stripes of the first bonding film 25 or third bonding film 45 are inside the outline profiles of the crystal vibrating devices 140. No concavities of the first bonding film 25 or third bonding film 45 are inside the outline profiles of the crystal vibrating device 140. As a result, bonding of the lid wafer 10WD, crystal wafer 20WD, and base wafer 40WD together can be performed firmly. As the bonding balls 75 melt, the resulting molten material flows along the stripes of the first bonding film 25 and stripes of the third bonding film 45 by capillary action by wetting the surfaces of the stripes. Adjacent concavities 66D are placed evenly so that the stripes on the major surfaces of the first and third bonding films 25, 45 can be wetted sufficiently.

Sixth Embodiment of Crystal Vibrating Device

Figure 8:
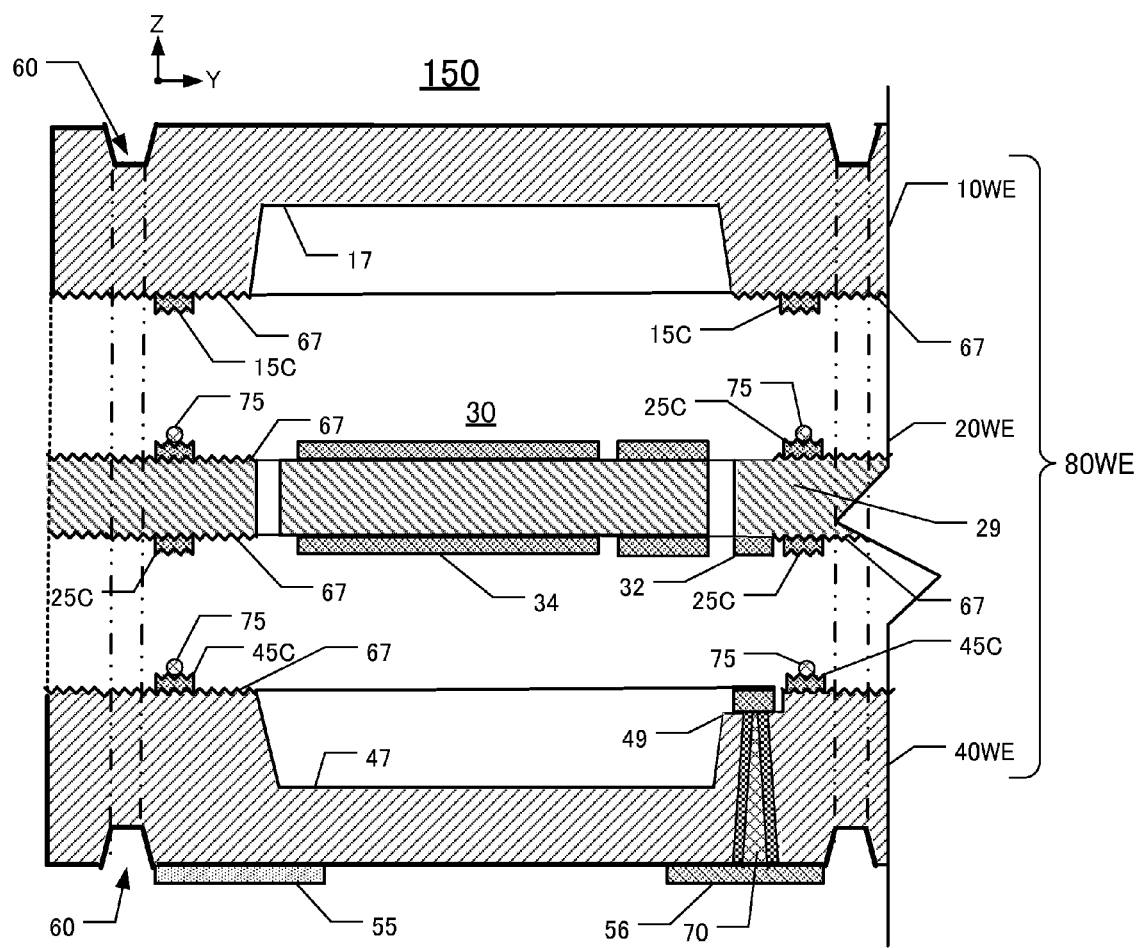
FIG. 8 is an enlarged elevational section of a sixth embodiment of a crystal vibrating device.

FIG. 8 is an enlarged elevational section of this embodiment 150 of a crystal vibrating device 150. The crystal vibrating device 150 is another variation of the first embodiment 100. FIG. 8 shows the package wafer 80WE comprising the crystal wafer 20WE comprising multiple tuning-fork type crystal vibrating pieces 30, the lid wafer 10WE, and the base wafer 40WE. In this figure, the respective wafers have not yet been bonded together.

The major surface of the lid wafer 10WE has roughened regions 67 formed by, for example, sand-blasting regions outside the periphery of the lid concavity 17. Similarly, roughened regions 67 are formed in regions of the major surface of the outer frame portion 29 of the crystal wafer 20WE. The base wafer 40WE also has a roughened surface 67 around the base concavity 47. The roughness Ra of the roughened surface 67 is 5 to 12 µm, for example. Because the stripes of the first, second, and third bonding films 25C, 15C and 45C, respectively, are formed on the roughened surface 67, the surfaces of the stripes are also roughened. The bonding balls 75 are placed on roughened stripes of the first and third bonding films 25C and 45C. Also, the stripes of the first, second, and third bonding films 25C, 15C and 45C have stronger adhesion to the crystal wafer 20WE, lid wafer 10WE, and base wafer 40WE.

As described in the sixth embodiment, roughening the surfaces 67 around the lid concavity 17, on the outer frame portion 29, or around the base concavity 47 can also be applied to the crystal vibrating devices of the second through sixth embodiments.

Seventh Embodiment of Crystal Vibrating Device

Figure 9:
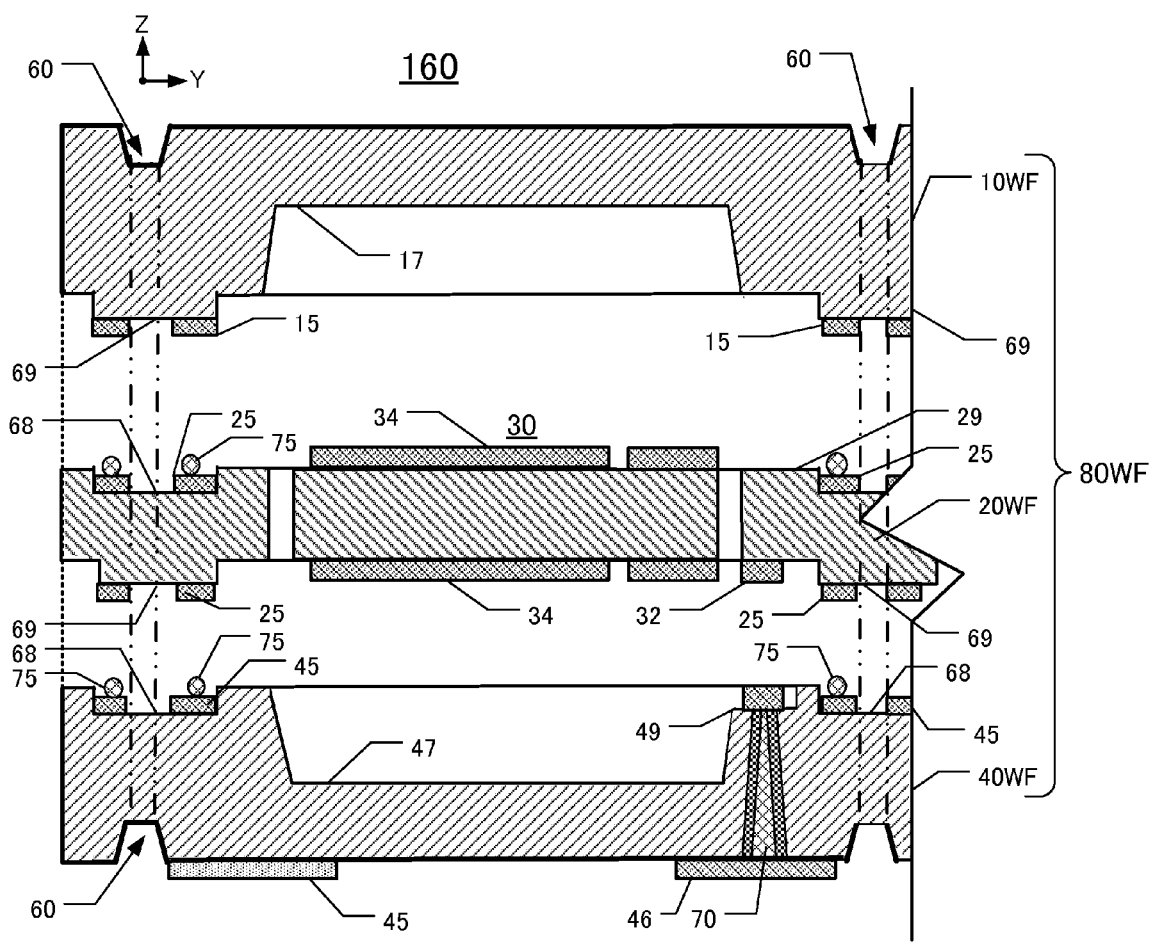
FIG. 9 is an enlarged elevational section of a seventh embodiment of a crystal vibrating device.

FIG. 9 is an enlarged elevational section of a crystal vibrating device 160 according to this embodiment. The crystal vibrating device 160 is similar to the first embodiment 100 (FIG. 3A), except that this seventh embodiment includes a step portion on the bonding surface of the crystal vibrating device 100. FIG. 9 shows the package wafer 80WF comprising a crystal wafer 20WF on which multiple tuning-fork type crystal vibrating pieces 30 have been formed, a lid wafer 10WF, and a base wafer 40WF. In this figure, the respective wafers are shown vertically separated from each other and not yet bonded together.

For each vibrating device 160, the lid wafer 10WF defines a step convexity 69 in the major surface facing the crystal wafer 20WF. Stripes of the second bonding film 15 are applied to the step convexity 69. A step concavity 68 is defined on the major surface of the crystal wafer 20WF facing the lid wafer 10WF. Stripes of a first bonding film 25 are applied to the floor of the step concavity 68. A step convexity 69 is defined on the major surface of the crystal wafer 20WF facing the base wafer 40WF, and stripes of the first bonding film 25 are applied to the step convexity 69. A step concavity 68 is defined on the major surface of the base wafer 49WF facing the crystal wafer 20WF, and stripes of a third bonding film 45 are formed on the floor of the step concavity 68.

Each step concavity 68 is sized to receive therein a respective step convexity 69. The first, second, and third bonding films 15, 25, and 45, respectively, are bonded together by material from respective bonding balls 75. Although not particularly illustrated, forming the step concavities 68 and the step convexity 69 can be applied to the crystal vibrating devices of the second through sixth embodiments.

Method for Manufacturing Crystal Vibrating Devices

Described below is an embodiment of a method for manufacturing crystal vibrating devices. Basically, the methods for making any of the crystal vibrating devices of the first through the seventh embodiments are similar. Hence, the method is described below in the context of the first embodiment of a crystal vibrating device 100 (FIGS. 1-3).

Figure 10A:
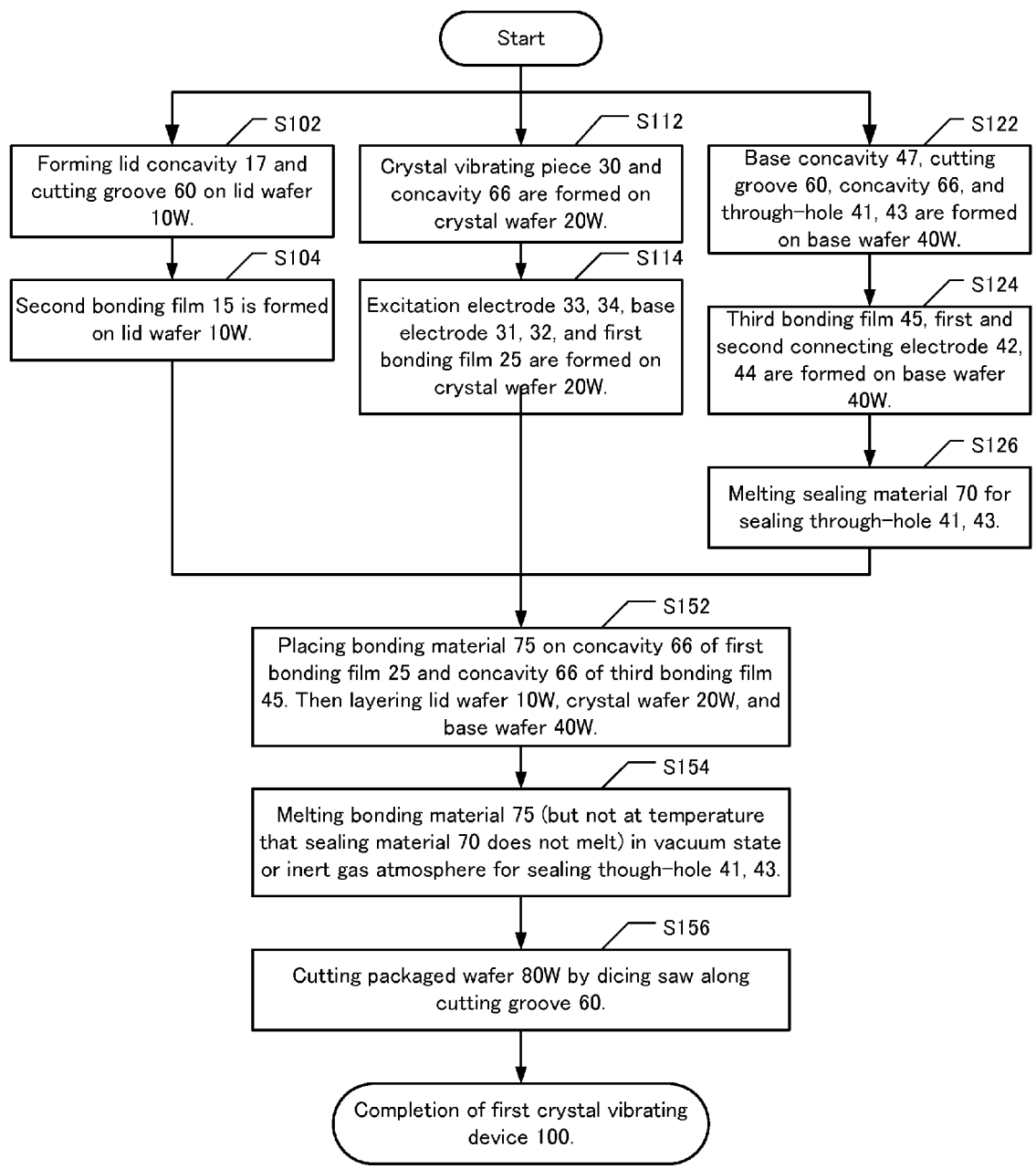
FIG. 10A is a flow-chart of a first embodiment of a method for manufacturing crystal vibrating devices of the first embodiment.

FIG. 10A is a flow chart of an embodiment of a method for manufacturing the crystal vibrating device 100. In steps S102 and S104 the lid wafer 10W is formed; in steps S112 and S114 the crystal wafer 20W is formed, and in steps S122 through S126 the base wafer 40W is formed. Steps after step S152 are performed on package wafers that are layered and bonded.

In step S102 hundreds to thousands of lids 10 (each having a lid concavity 17 and cutting grooves 60) are formed on the lid wafer 10W. The lid concavity 17 and the cutting groove 60 are both formed by etching or machine processing. In step S104 the second bonding film 15 (comprising a gold (Au) layer) is applied as stripes to the lid wafer 10W. In step S112 the crystal frames 20 (each having a crystal vibrating piece 30 and concavities 66) are formed on a crystal wafer 20W by wet-etching. Hundreds to thousands of crystal frames 20 are formed on one crystal wafer 20W. In step S114, respective excitation electrodes 33, 34, base electrodes 31, 32, and stripes of the first bonding film 25 are formed on each crystal vibrating piece 30 of the crystal wafer 20W. Each electrode and stripe of the first bonding film is formed as a layer of gold on a layer of chromium. On the base wafer, corresponding to each stripe of the bonding film 25, stripes of the third bonding film 45 are applied in the floor of each respective concavity 66. In step S122 each base 40 is provided with a respective base concavity 47, cutting grooves 60, concavities 66, and first and second through-holes 41, 43. If the base wafer 40W is made of glass, for example, the base concavity 47, as well as the concavity 66, are formed by wet-etching or machine processing. Hundreds to thousands of the bases 40 can be formed on one base wafer 40W.

In step S124 stripes of the third bonding film 45 as well as first and second connecting electrodes 42, 44 are formed on the base wafer 40W. The third bonding film 45 desirably comprises a layer of gold (Au) having four sides. In step S126 the first and second through-holes 41, 43 are sealed by molten sealing material 70. First and second external electrodes 55, 56 are formed on the respective sealed through-holes. The sealing material 70 is a eutectic metal gold-silicon material such as $Au_{3.15}Si$ alloy or gold-germanium material such as $Au_{12}Ge$ alloy. The melting temperature of the gold-silicone alloy is 363° C. and that of the gold-germanium is 356° C.

In step S152 respective bonding balls 75 are placed on each concavity 66 of the stripes of first bonding film 25 and third bonding film 45. Then, the lid wafer 10W, the crystal wafer 20W, and the base wafer 40W are aligned with each other and formed into a sandwich in which the crystal wafer 20WF is situated between the lid wafer and base wafer. These wafers are aligned with each other using the orientation flat 10f shown in FIG. 11.

In step S154 a package wafer 80W is formed by melting the bonding balls 75 under in a vacuum or in an inert gas atmosphere. Each bonding ball 75 is a eutectic metal ball, for example, gold-tin ($Au_{20}Sn$). The melting temperature of the gold-tin in the metal balls is 280° C., which is lower than the melting temperature of the eutectic metal used for the sealing material 70 in step S126. Therefore, in step 154, the sealing material 70 normally does not melt as the bonding balls 75 are being melted.

In step S156, the package wafer 80W is cut along the cutting grooves using a dicing saw. Inside each crystal vibrating device 100 is a vacuum environment or an inert-gas atmosphere. The crystal vibrating devices 100 produce stable oscillations.

Figure 10B:
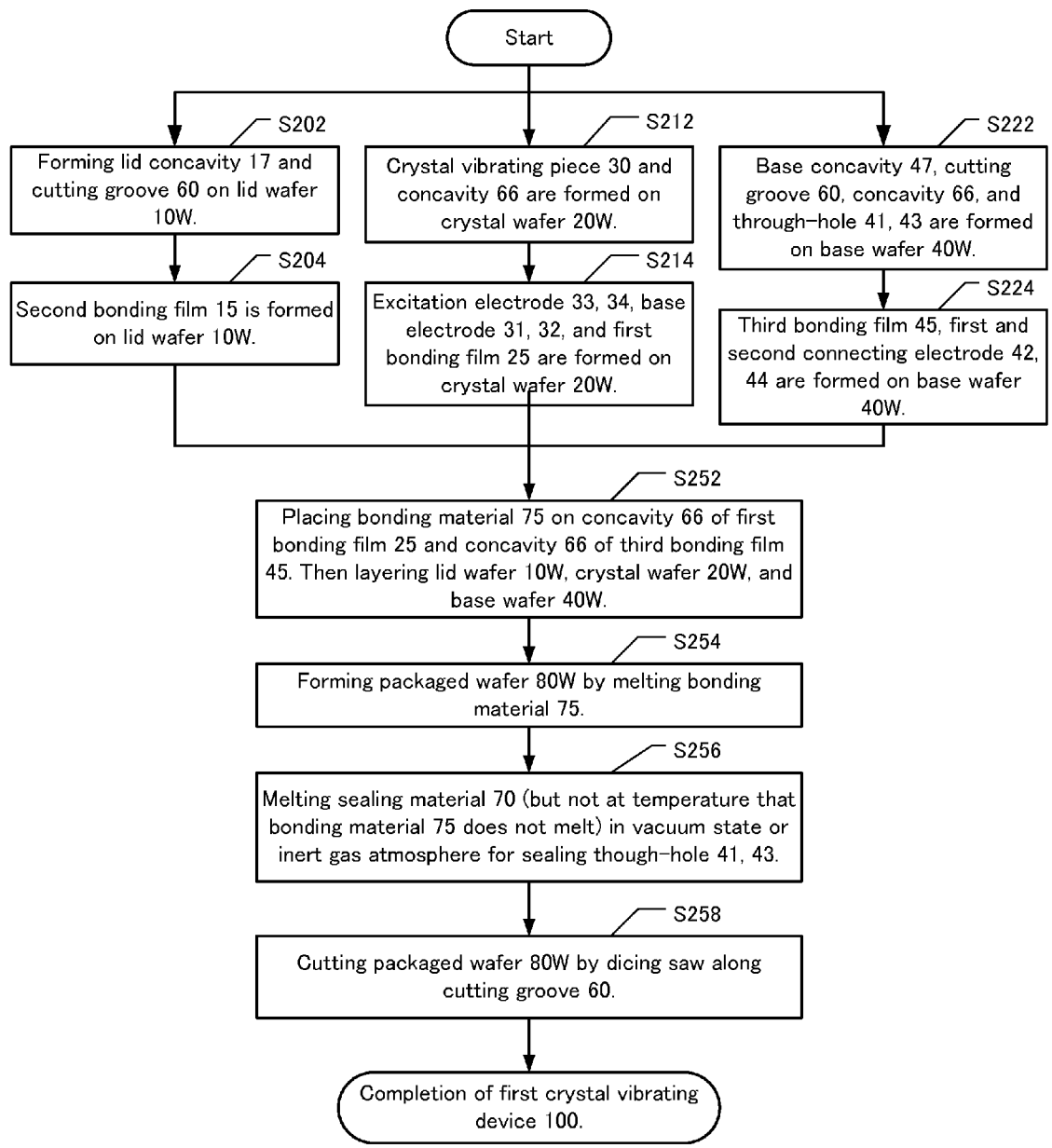
FIG. 10B is a flow-chart of a second embodiment of a method for manufacturing crystal vibrating devices of the first embodiment.
Figure 11:
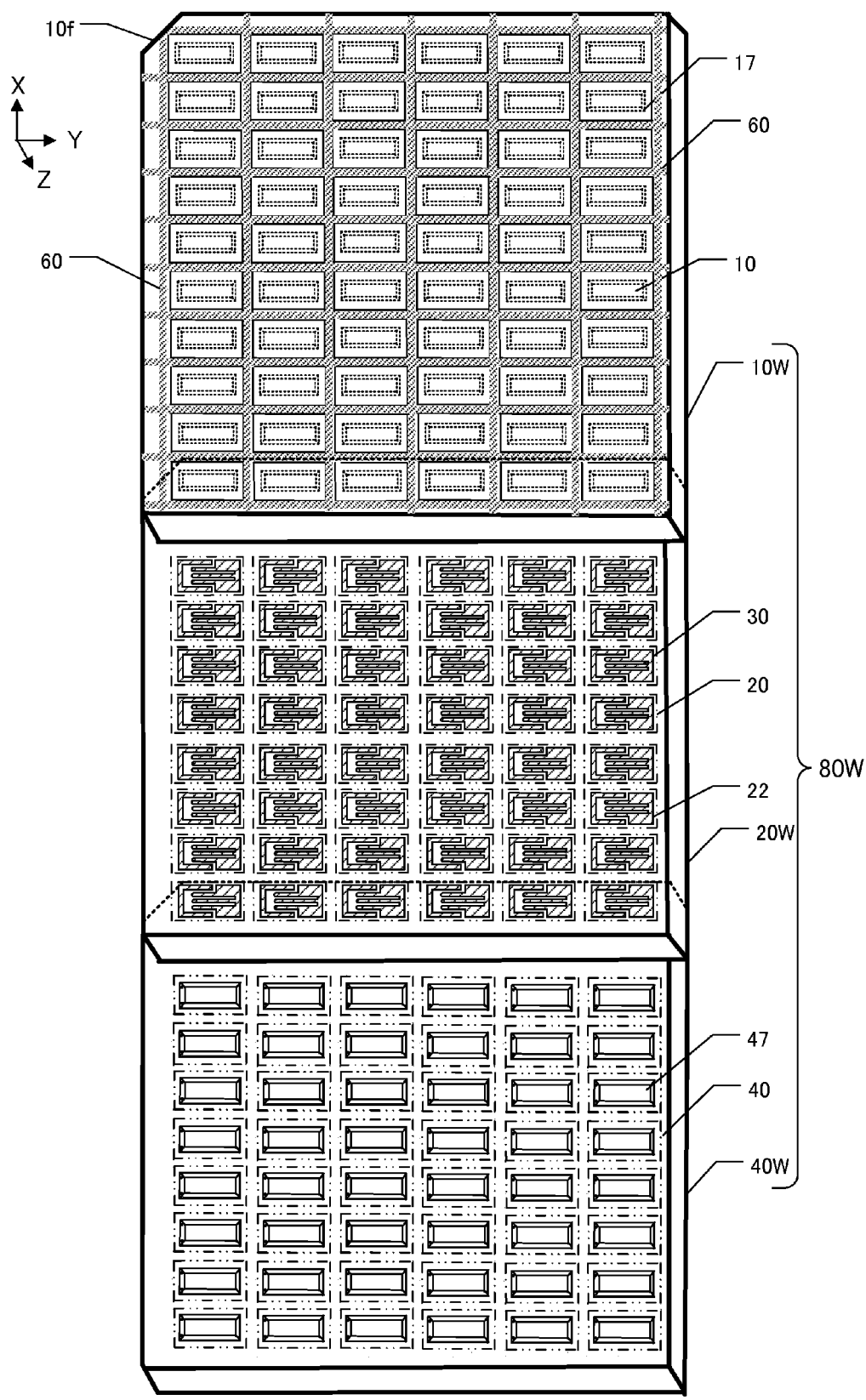
FIG. 11 is a plan view indicating the manner in which the lid wafer, crystal wafer, and base wafer are layered in registration with each other.

FIG. 10B is a flow-chart of a second embodiment of a method for manufacturing the crystal vibrating device 100. Steps S202 and S204 pertain to the lid wafer 10W, steps S212 and S214 pertain to the crystal wafer 20W, and steps S222 and S224 pertain to the base wafer 40W. Steps S252 to end pertain to the three-wafer sandwich of the package wafer. In step S202 hundreds to thousands of lids 10, each having a respective lid concavity 17 and cutting grooves 60, are formed on the lid wafer 10W. In step S204 stripes of the second bonding film 15, each being a gold (Au) layer, are formed in rectangular patterns with four sides on the inner major surface of the lid wafer 10W. In step S212 hundreds to thousands of crystal frames 20, each having a respective crystal vibrating piece 30 and concavities 66, are formed on the crystal wafer 20W by wet-etching. In step S214, excitation electrodes 33, 34 and stripes of the first bonding film 25 are formed on each crystal vibrating piece 30 formed on the crystal wafer 20W. Each electrode and stripe of the bonding film is a gold layer formed on a chromium layer. The stripes of first bonding film 25 extend on the concavities 66. In step S222 a base concavity 47, cutting grooves 60, concavities 66, and first and second through-holes 41, 43 are formed for each base on the base wafer 40W. If the base wafer 40W is made of glass, for example, the base concavity 47 and the concavity 66 are formed by etching or machine processing. In step S224 stripes of the third bonding film 45 and first and second connecting electrodes 42, 44 are formed on the base wafer 40W. The stripes of the third bonding film 45 comprise, for example, a gold (Au) layer and are arranged as rectangles with four sides each. In step S252 bonding balls 75 are placed on the concavities 66 of the stripes of the first bonding film 25 and of the third bonding film 45. Then, the lid wafer 10W, crystal wafer 20W, and base wafer 40W are aligned with each other in the Z-direction, as aided by the orientation flat 10f (FIG. 11). In step S254 the package wafer 80W is formed by melting the bonding balls 75. Each bonding ball 75 is a eutectic metal ball made of gold-silicon ($Au_{3.15}Si$) or gold-germanium ($Au_{12}Ge$). The melting temperature of the gold-silicone alloy is 363° C. and of the gold-germanium alloy is 356° C. In step S256 the first and second through-holes 41, 43 are sealed, in a vacuum or inert-gas atmosphere, using a molten sealing material 70. The first and second external electrodes 55, 56 are formed on the sealed through-holes. The sealing material 70 for each through-hole can be a respective eutectic metal ball, such as gold-tin alloy ($Au_{20}Sn$). The melting temperature of the gold-tin alloy is 280°, which is lower than the melting temperature of the bonding balls 75 used in step S254. Consequently, in step 256 the bonding ball 75 does not melt when the sealing material 70 is melted. In step S258, the package wafer 80W is cut along the cutting grooves using a dicing saw. Thus, manufacturing the crystal vibrating devices 100 is completed.

FIG. 11 is an essentially plan view showing the manner in which the lid wafer 10W (comprising multiple lids 10), the crystal wafer 20W (comprising multiple crystal frames 20 each including a respective tuning-fork type crystal vibrating piece 30), and the base wafer 40W (comprising multiple bases 40) are layered relative to each other. Cutting grooves 60 are formed on the major surface of the lid wafer 10W. To distinguish the tuning-fork type crystal vibrating pieces 30 from the respective crystal frames 20, the spaces 22 are shown as shaded areas.

Each lid wafer 10W, crystal wafer 20, and base wafer 40W is, for example, four inches in diameter. Each wafer includes the orientation flat 10f by which the three wafers are aligned and stacked precisely.

In the foregoing embodiments, the concavities 66A are not formed on the stripes of the second bonding film 15 on the lid wafer 10W or on the stripes of the first bonding film 25 on the lower major surface of the crystal wafer 20W. However, if concavities 66A are formed in these locations, bonding balls 75 placed in the concavities 66A would act as alignment aids for the three wafers so that the orientation flat 10f would not be needed.

The representative embodiments are described above in the context of various respective configurations of crystal vibrating devices. By forming the package with bonding films formed on the lid, the piezoelectric frame, and the base, and by using bonding materials, airtightness of the piezoelectric device is improved.

Each of the various embodiments described above comprises a tuning-fork type crystal vibrating piece. Alternatively, an AT-cut crystal panel exhibiting thickness shear vibration can be used for the same effect. Also, the respective combinations of bonding surfaces and/or the shape of bonding material can be changed.

What is claimed is:

1. A method for manufacturing a piezoelectric device, the method comprising:
    preparing a piezoelectric wafer defining multiple piezoelectric frames, the frames including respective piezoelectric vibrating pieces and respective frame portions surrounding the piezoelectric vibrating pieces, the piezoelectric vibrating pieces including respective excitation electrodes;
    preparing a lid wafer defining multiple lids, the lids being individually sized substantially similarly to the respective frame portions on the piezoelectric frames;
    preparing a base wafer defining multiple bases, the bases being individually sized substantially similarly to the respective frame portions on the piezoelectric frame and individually defining at least one respective through-hole extending through a thickness of the respective base;
    forming stripes of a first bonding film on both major surfaces of the piezoelectric wafer, the stripes being arranged into rectangular patterns, each pattern extending inboard of a periphery of a respective frame portion;
    forming stripes of a second bonding film on one major surface of the lid wafer so as to correspond to the respective stripes of the first bonding film;
    forming stripes of a third bonding film on one major surface of the base wafer so as to correspond to the respective stripes of the first bonding film;
    placing bonding material between the stripes of the first bonding film and corresponding stripes of the second bonding film, and between the stripes of the first bonding film and corresponding stripes of the third bonding film;
    forming a sandwich of the piezoelectric wafer between the lid wafer and base wafer, in which the respective stripes of the first bonding film and the corresponding second bonding film and the respective stripes of the first bonding film and the corresponding third bonding film are aligned with each other;
    causing the bonding material to bond together the piezoelectric wafer, lid wafer, and base wafer; and
    after bonding, and in a vacuum or inert gas atmosphere, sealing the through-holes using a sealing material that melts at a temperature lower than a melting point of the bonding material;
    wherein respective concavities are defined outboard of extreme peripheries of the respective piezoelectric vibrating devices; and
    the bonding material is placed on the respective concavities.

2. The method of claim 1, wherein the bonded wafer is cut along the concavities.

3. The method of claim 2, further comprising:
    roughening the major surfaces of the frames in regions in which the stripes of the first bonding film are formed, thereby forming roughened stripes of the first bonding material;
    roughening the major surfaces of the lids in regions in which the stripes of the second bonding film are formed, thereby forming roughened stripes of the second bonding material; and
    roughening the major surfaces of the bases in regions in which the stripes of the third bonding film are formed, thereby forming roughened stripes of the third bonding material.

4. The method of claim 1, further comprising:
    roughening the major surfaces of the frames in regions in which the stripes of the first bonding film are formed, thereby forming roughened stripes of the first bonding material;
    roughening the major surfaces of the lids in regions in which the stripes of the second bonding film are formed, thereby forming roughened stripes of the second bonding material; and
    roughening the major surfaces of the bases in regions in which the stripes of the third bonding film are formed, thereby forming roughened stripes of the third bonding material.

5. A method for manufacturing a piezoelectric device, comprising the steps of:
    preparing a piezoelectric wafer defining multiple piezoelectric frames, the frames including respective piezoelectric vibrating pieces and respective frame portions surrounding the piezoelectric vibrating pieces, the piezoelectric vibrating pieces including respective excitation electrodes;
    preparing a lid wafer defining multiple lids, the lids being individually sized substantially similarly to the respective frame portions on the piezoelectric frames;
    preparing a base wafer defining multiple bases, the bases being individually sized substantially similarly to the respective frame portions on the piezoelectric frames and individually defining at least one respective through-hole extending through a thickness of the respective base;
    forming stripes of a first bonding film on both major surfaces of the piezoelectric wafer, the stripes being arranged into rectangular patterns, each pattern extending inboard of a periphery of tithe respective frame portion;
    forming stripes of a second bonding film on one major surface of the lid wafer so as to correspond to the respective stripes of the first bonding film;
    forming stripes of a third bonding film on one major surface of the base wafer so as to correspond to the respective stripes of the first bonding film;
    placing bonding material between the stripes of the first bonding film and corresponding stripes of the second bonding film, and between the stripes of the first bonding film and corresponding stripes of the third bonding film;
    forming a sandwich of the piezoelectric wafer between the lid wafer and base wafer, in which respective stripes of the first bonding film and the corresponding second bonding film and the respective stripes of the first bonding film and the corresponding third bonding film are aligned with each other, and causing the bonding material to bond together the piezoelectric wafer, lid wafer, and base wafer; and
    after bonding, and in a vacuum or inert gas atmosphere, sealing the respective through-holes using a sealing material that melts at a temperature lower than a melting point of the bonding material;
    wherein stripes of the first bonding film are formed just inboard of extreme peripheries of the frame portions, thereby forming said stripes on the frame portions as respective rectangular stripe patterns;
    stripes of the second bonding film are formed just inboard of extreme peripheries of the lids, thereby forming said stripes on the lids as respective rectangular stripe patterns; and stripes of the third bonding film are formed just inboard of extreme peripheries of the bases, thereby forming said stripes on the bases as respective rectangular stripe patterns.

6. The method of claim 5, further comprising:

roughening the major surfaces of the frames in regions in which the stripes of the first bonding film are formed, thereby forming roughened stripes of the first bonding material;

roughening the major surfaces of the lids in regions in which the stripes of the second bonding film are formed, thereby forming roughened stripes of the second bonding material; and roughening the major surfaces of the bases in regions in which the stripes of the third bonding film are formed, thereby forming roughened stripes of the third bonding material.

* * * * *